(12) United States Patent
Lin et al.

(10) Patent No.: US 10,748,850 B2
(45) Date of Patent: Aug. 18, 2020

(54) THINNED SEMICONDUCTOR PACKAGE AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Takashi Noma, Ota (JP); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/921,898

(22) Filed: Mar. 15, 2018

(65) Prior Publication Data

US 2019/0287913 A1    Sep. 19, 2019

(51) Int. Cl.
*H01L 21/56* (2006.01)
*H01L 23/532* (2006.01)
*H01L 23/00* (2006.01)

(52) U.S. Cl.
CPC ........ *H01L 23/53233* (2013.01); *H01L 24/11* (2013.01); *H01L 24/33* (2013.01)

(58) Field of Classification Search
CPC ... H01L 23/53233; H01L 24/11; H01L 24/33; H01L 25/0657
See application file for complete search history.

(56) References Cited

U.S. PATENT DOCUMENTS

| | | | |
|---|---|---|---|
| 7,682,874 B2 | 3/2010 | Xiaochun | |
| 7,745,261 B2 * | 6/2010 | Tan | H01L 21/561 438/113 |
| 8,836,146 B2 * | 9/2014 | Chou | H01L 23/3157 257/780 |
| 2003/0155641 A1 * | 8/2003 | Yeo | H01L 23/3677 257/691 |
| 2006/0046436 A1 * | 3/2006 | Ohuchi | H01L 23/3114 438/460 |
| 2013/0037935 A1 * | 2/2013 | Xue | H01L 23/3114 257/737 |
| 2013/0210215 A1 * | 8/2013 | Xue | H01L 21/561 438/462 |

* cited by examiner

*Primary Examiner* — Hoa B Trinh
(74) *Attorney, Agent, or Firm* — Adam R. Stephenson, Ltd.

(57) ABSTRACT

Implementations of semiconductor packages may include a die having a first side and a second side opposite the first side, a first metal layer coupled to the first side of the die, a tin layer coupled to the first metal layer, the first metal layer between the die and the tin layer, a backside metal layer coupled to the second side of the die, and a mold compound coupled to the die. The mold compound may cover a plurality of sidewalls of the first metal layer and a plurality of sidewalls of the tin layer and a surface of the mold compound is coplanar with a surface of the tin layer.

14 Claims, 5 Drawing Sheets

THINNED SEMICONDUCTOR PACKAGE AND RELATED METHODS

BACKGROUND

1. Technical Field

Aspects of this document relate generally to semiconductor packages. More specific implementations involve thinned power semiconductor packages with a dual side metallization structure and methods of making such thinned power semiconductor packages.

2. Background

Semiconductor package fabrication processes may involve many steps. In some processes a wafer receives one or more layers, such as electrically conductive layers. Electrically conductive layers may be used to provide electrical contact areas of individual semiconductor devices singulated from the wafer. Electrically conductive layers may be formed using sputtering, evaporation, or electroplating operations. Further, in some processes the overall size of the semiconductor package may designed to be minimized which may result in economic benefits as well as technological benefits.

SUMMARY

Implementations of semiconductor packages may include a die having a first side and a second side opposite the first side, a first metal layer coupled to the first side of the die, a tin layer coupled to the first metal layer, the first metal layer between the die and the tin layer, a backside metal layer coupled to the second side of the die, and a mold compound coupled to the die. The mold compound may cover a plurality of sidewalls of the first metal layer and a plurality of sidewalls of the tin layer and a surface of the mold compound is coplanar with a surface of the tin layer.

Implementations of semiconductor packages may include one, all, or any of the following:

A second metal layer may be coupled between the die and the first metal layer.

A plurality of bumps may be included in the first metal layer and the tin layer.

The mold compound may cover a first and a second side of each bump of the plurality of bumps.

A third side, a fourth side, a fifth side, and a sixth side of the die may be covered by the mold compound.

The backside metal layer may include copper.

The backside metal layer may include a metal alloy comprising titanium, nickel, silver, vanadium, copper, and any combination thereof.

Implementations of a method of forming a semiconductor package may include forming a plurality of bumps on a first side of a wafer, forming a plurality of recesses into the first side of the wafer to a desired depth into the wafer, and applying a mold compound to the first side of the wafer. The mold compound may encapsulate the plurality of bumps and fill the plurality of recesses. The method may also include thinning a second side of the wafer to the desired depth of the plurality of recesses, coupling a backside metal layer to the second side of the wafer, exposing the plurality of bumps through the mold compound by grinding the mold compound; and singulating the mold compound through the plurality of recesses into a plurality of semiconductor packages.

Implementations of a method for forming a semiconductor package may include one, all, or any of the following:

Each bump of the plurality of bumps may include a first metal layer and a second metal layer. The first metal layer may be between the second metal layer and the wafer.

The method may include forming a plurality of openings in the backside metal layer.

The backside metal layer may include copper.

The second metal layer may include tin.

The method may include planarizing the outer surface of the plurality of bumps with the outer surface of the mold compound.

Each bump of the plurality of bumps may also include a third metal layer, wherein the first metal layer includes copper, the second metal layer includes tin, and the third metal layer includes aluminum.

Implementations of a method of forming a semiconductor package may include forming a plurality of bumps on a first side of a wafer, forming a plurality of recesses into the first side of the wafer, and applying a mold compound to the first side of the wafer. The mold compound may encapsulate the plurality of bumps and fill the plurality of recesses. The method for forming a semiconductor package may also include backgrinding a second side of the wafer to reach the plurality of recesses and singulate a plurality of die from the wafer, coupling a backside metal layer to a second side of the plurality of die, exposing the plurality of bumps through the mold compound by grinding the mold compound, and singulating the mold compound at the plurality of recesses to form a plurality of semiconductor packages Each bump of the plurality of bumps may include a first metal layer and a second metal layer. The first metal layer may be between the second metal layer and the wafer.

Each bump of the plurality of bumps may include a third metal layer.

The backside metal layer may include a metal including one of titanium, nickel, silver, vanadium, copper, and any combination thereof.

The second metal layer may include tin.

The method may include planarizing the outer surface of the plurality of bumps with the outer surface of the mold compound.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
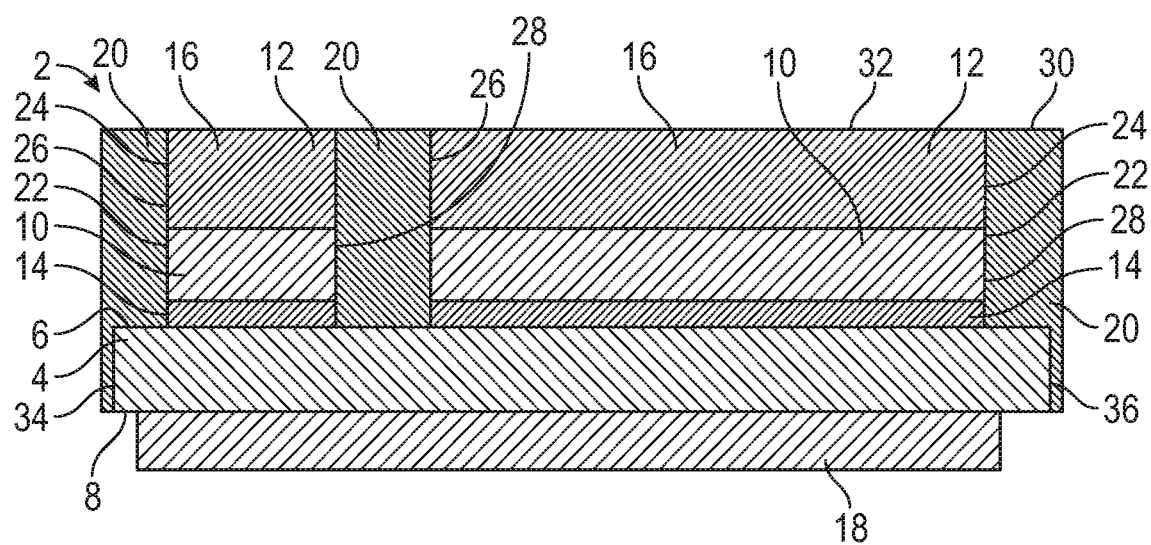
FIG. 1 is a cross-section side view of a first implementation of a semiconductor package.

Referring to FIG. 1, a cross-section side view of a first implementation of a semiconductor package is illustrated. In various implementations, the semiconductor packages disclosed herein may include power semiconductor devices, however, in other implementations other semiconductor device types (transistors, microprocessors, passive components, etc.) may be included in the semiconductor packages. In various implementations, the semiconductor package 2 includes a die 4. The die 4 may be a silicon die, and in such implementations, the silicon die could be any type of silicon die including, by non-limiting example, an epitaxial silicon die, silicon-on-insulator, polysilicon, any combination thereof, or any other silicon-containing die material. Further, it is also understood that in various implementations a die other than a silicon-containing die may be used, such as, by non-limiting example, gallium arsenide, silicon carbide, gallium arsenide, or a metal-containing die. The die 4 has a first side 6 and a second side 8 opposite the first side. In various implementations, the thickness of the die 4 is less than 50 micrometers (um), however, in other implementations the thickness of the die may be 50 um or more than 50 um.

In various implementations, the semiconductor package 2 may include a first metal layer 10 coupled to the first side 6 of the die 4. In such implementations, the first metal layer 10 may be, by non-limiting example, copper, aluminum, tin, silver, gold, titanium, nickel, or any other metal or metal alloy. In various implementations, the first metal layer 10 may be directly coupled to the first side 6 of the die 4, while in other implementations, as is illustrated by FIG. 1, the first metal layer may be indirectly coupled to the die 4. In various implementations, the semiconductor package 2 may include a tin layer 12 coupled to the first metal layer 10. While this disclosure primarily refers to a tin layer coupled over the first metal layer, it is understood that any other electrically and/or thermally conductive material, including any metal or metal alloy disclosed herein, may be used in place of the tin. Also, the tin used in the tin layer may be tin or a tin alloy, such as, by non-limiting example, tin/silver, tin/silver/copper, tin/antimony, and tin/lead. In various implementations, and as illustrated by FIG. 1, the tin layer 12 may be directly coupled to the first metal layer 10 with the first metal layer 10 between the tin layer and the die 4. In other implementations the tin layer 12 may be indirectly coupled to the first metal layer 10.

In various implementations, the semiconductor package 2 may include a second metal layer 14 coupled between the die 4 and the first metal layer 10. In such implementations, the semiconductor package 2 includes at least three metal layers over the die 4. The second metal layer 14 may be any type of metal or metal alloy disclosed herein. In particular implementations, the second metal layer may include tin or a tin alloy, such as, by non-limiting example, tin/silver, tin/silver/copper, tin/antimony, and tin/lead. In other particular implementations, the second metal layer 14 may include aluminum, the first metal layer 10 may include copper, and the tin layer 12 may be over and coupled to the copper layer.

In various implementations, the tin layer 12 and the first metal layer 10 may be formed into and include a plurality of bumps/studs 16. In implementations including a second metal layer 14 between the first metal layer 10 and the die 4, the second metal layer 14 may also be patterned to form a portion of the plurality of bumps 16. In particular implementations, not all three metal layers are patterned to form a plurality of bumps, but only the two outermost metal layers (in implementations having three or more metal layers over the die 4) include the plurality of bumps. In still other implementations, only the tin layer 12 may be patterned to form or include the plurality of bumps. In various implementations, and as illustrated by FIG. 1, the plurality of bumps 16 may include two bumps, however, in other implementations the plurality of bumps may include more than two bumps.

In various implementations, rather than having a plurality of metal layers forming the bumps as illustrated by FIG. 1, a single metal or metal alloy layer, including, by non-limiting example, copper, aluminum, tin, a solder, or any combination thereof, may form the plurality of bumps and may be directly coupled to the die 4. In other implementations, and as illustrated by FIG. 1, each bump of the plurality of bumps 16 may include multiple layers with a tin layer 12 coupled over the copper layer. In such implementations, the semiconductor package 2 may have the benefit of being able to bond to external connections through the tin layer 12 while also maintaining the benefit of having a copper bump or stud. In various implementations, the tin layer 12 may be much thinner than the first metal layer 10, while in other implementations, the tin layer 12 may be as thick as or thicker than the first metal layer 10. In implementations with a second metal layer 14 coupled between the first metal layer 10 and the die 4, the second metal layer may be less thick, as thick, or more thick than the first metal layer when viewed in a cross sectional view of the die 4.

In various implementations, the semiconductor package 2 may include a backside metal layer 18 coupled to the second side 8 of the die 4. The backside metal layer 18 may be any metal disclosed herein, and in various implementations, may include copper. In particular implementations, the backside metal layer may include, by non-limiting example, Ti/Ni/Cu, Ti/Cu, TiW/Cu, or any other type of metal stack or metal alloy including copper. In various implementations, and as illustrated by FIG. 1, the length of the backside metal layer 18 may be less than the length of the die 4. In such implementations, the die 4 may overhang the backside metal layer 18. In other implementations, the length of the backmetal layer 18 may be substantially the same as the length of the die 4 with the sides of the backmetal layer coextensive with the sides/perimeter of the die. In still other implementations, the back metal layer may extend beyond the sides/perimeter of the die 4. In various implementations, the back metal layer may be patterned.

Still referring to FIG. 1, in various implementations the semiconductor package 2 may include a mold compound 20. The mold compound 20 may be coupled to the die 4. In various implementations, the mold compound may include, by non-limiting example, an epoxy mold compound, an acrylic mold compound, or any other type of mold compound or protective covering capable of hardening and providing physical support and protection to a semiconductor device. In various implementations, the mold compound 20 may cover a plurality of sidewalls 22 of the first metal layer 10 and a plurality of sidewalls 24 of the tin layer. In implementations with a plurality of bumps 16, the mold compound may cover a first side 26 and a second side 28 of each bump. In various implementations, a surface 30 of the mold compound may be substantially coplanar and level with a surface 32 of the tin layer 12. In various implementations, and as is illustrated by FIG. 1, the mold compound 20 may cover the sides of the die. Specifically, the mold compound 20 may cover a third side 34 of the die 4, a fourth side 36 of the die 4, a fifth side (oriented as going into the page in FIG. 1) of the die, and a sixth side (oriented as coming off the page in FIG. 1) of the die. In the implementation illustrated by FIG. 1, the entirety of the sides of the die are covered by the mold compound 20, however, in other implementations the sides of the die 4 may only partially be covered by a mold compound 20, while in still other implementations the mold compound 20 may not cover the sides of the die 4. In various implementations, a portion of the second side 8 of the die may be covered by a mold compound. The mold compound covering the second side of the die 4 may be the same or a separate mold compound from the mold compound 20. In such implementations, the mold compound 20 may also cover the sides of the backmetal layer 18 in implementations where the backmetal layer is the same length as or shorter than the length of the die 4.

Figure 2:
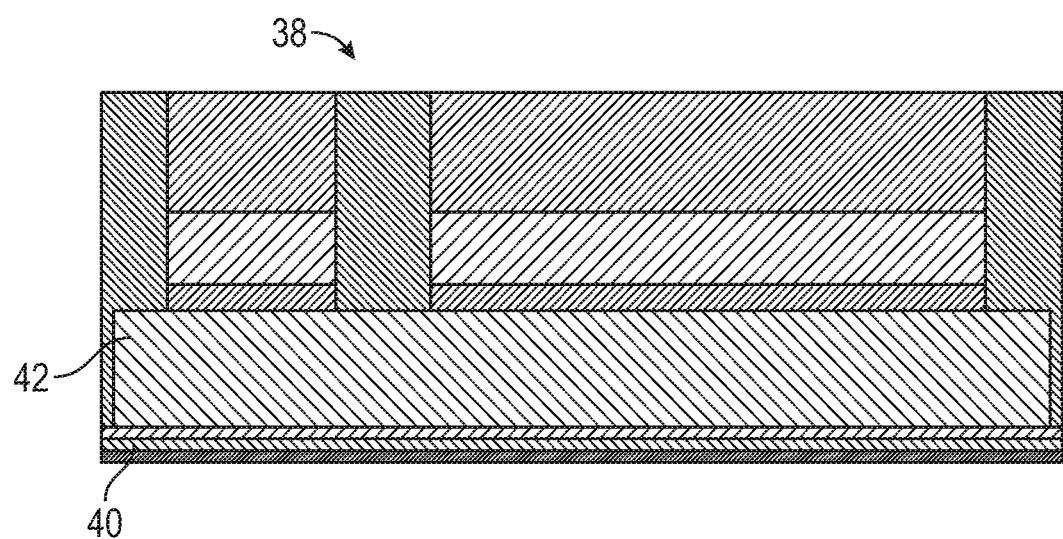
FIG. 2 is a cross-section side view of a second implementation of a semiconductor package.

Referring to FIG. 2, a cross-section side view of a second implementation of a semiconductor package is illustrated. The semiconductor package of FIG. 2 may be similar to the semiconductor package of FIG. 1, with the difference being that the backside metal layer 40 may extend beyond the length of the die 42 and may be coextensive with the sides/perimeter of the semiconductor package 38. Further, as illustrated by FIG. 2, the backside metal layer 40 may include multiple layers, and in particular implementations, may include three layers. The backside metal layer may include, by non-limiting example, a metal or metal alloy including titanium, nickel, silver, vanadium, copper, and any combination thereof. In particular implementations, the backmetal layer 40 may include a layer including titanium, a layer including nickel, and a layer including a silver copper alloy. In other particular implementations, the backmetal layer may include a layer including titanium, a layer including a nickel vanadium alloy, and a layer including a silver-copper alloy.

Figure 3A:
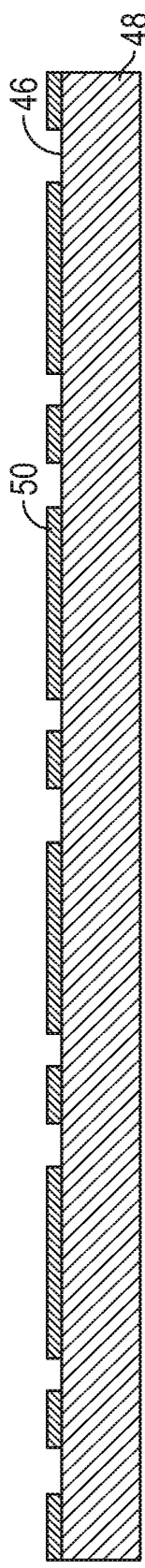
FIGS. 3A-3G are cross-section side views illustrating a semiconductor device following various steps of a method for forming the semiconductor package of FIG. 1.
Figure 3B:
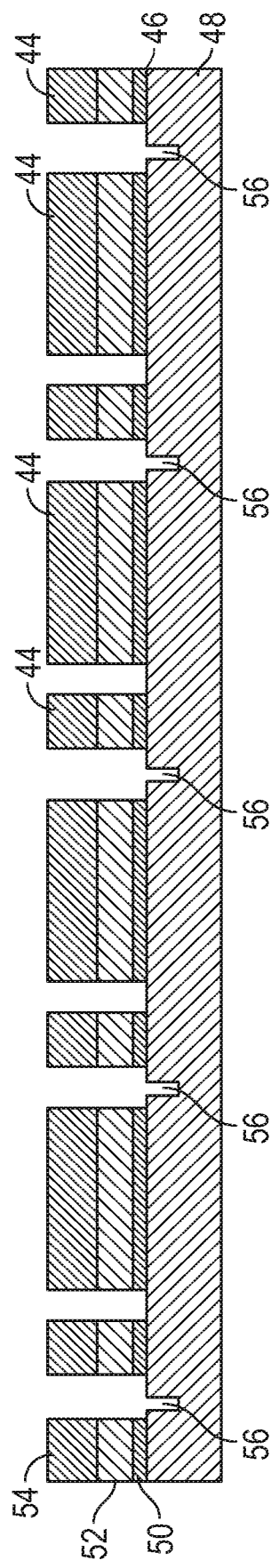

Referring to FIGS. 3A-3G, cross-section side views of a semiconductor device following various steps of an implementation of a method for forming the semiconductor package of FIG. 1 are illustrated. Referring specifically to FIGS. 3A-3B, a method for forming the semiconductor package of FIG. 1 may include forming a plurality of bumps/studs 44 on a first side 46 of a wafer 48. More specifically, the method may include forming a third metal 50 on the first side 46 of the wafer 48. The third metal layer 50 may be any metal disclosed herein, and in particular implementations, may include aluminum. The third metal layer 50 may be patterned, as illustrated by FIG. 3A, however, in other implementations the third metal layer may not necessarily be patterned.

Referring to FIG. 3B, the method may include forming a first metal layer 52 over the third metal layer 50. The first metal layer 52 may be any metal disclosed herein, and in particular implementations, includes copper. The first metal layer 52 may be patterned, as illustrated by FIG. 3B, however, in other implementations the first metal layer may not be patterned. In various implementations, the method may also include forming a second metal layer 54 over the first metal layer 52. The second metal layer 54 may be any metal disclosed herein, and in particular implementations, includes tin. The second metal layer 54 may also include a solder material. The second metal layer 54 may be patterned as illustrated by FIG. 3B, however, in other implementations where additional conductive layers cover the second metal layer 54, the second metal layer may not necessarily be patterned.

In various implementations, the method for forming the semiconductor package of FIG. 1 includes forming non-patterned metal layers over the first side 46 of the wafer 48. The method may then include etching through any number of the metal layers, including all of the metal layers coupled over the first side 46 of the wafer 48, in order to form the plurality of bumps 44. In various implementations, less than three metal layers may be coupled over the first side 46 of the wafer 48, and in particular implementations, only a single metal layer may be formed and coupled directly to the first side 46 of the wafer 48. In other implementations, more than three metal layers may be formed over the first side 46 of the wafer 48. The metal layers coupled to the first side 46 of the wafer 48 may be used to form any number of bumps over the wafer.

Referring specifically to FIG. 3B, the method for forming the semiconductor package of FIG. 1 may include forming a plurality of recesses 56 into the first side 46 of the wafer 48 to a desired depth into the wafer. In particular implementations, the depth of each recess of the plurality of recesses 56 may be less than 50 um, while in other implementations the depth may be 50 or more micrometers depending on the thickness of the wafer. In various implementations, the plurality of recesses 56 may be formed using a saw, a laser, a plasma etch, a chemical etch, or any other method for forming a recess in a wafer. In implementations where an etch is used, the etch may be an etching process marketed under the tradename BOSCH® (the "Bosch process") by Robert Bosch GmbH, Stuttgart, Germany, may be used to form the plurality of recesses 56 in the wafer 48. In such implementations, the sidewalls of the plurality of recesses 56 may be slightly patterned or ridged which may facilitate adhesion of a mold compound to the sidewalls of the plurality of recesses 56. In various implementations, the plurality of recesses 56 may be positioned in the wafer 48 so that they are between the semiconductor devices in the wafer.

Figure 3C:
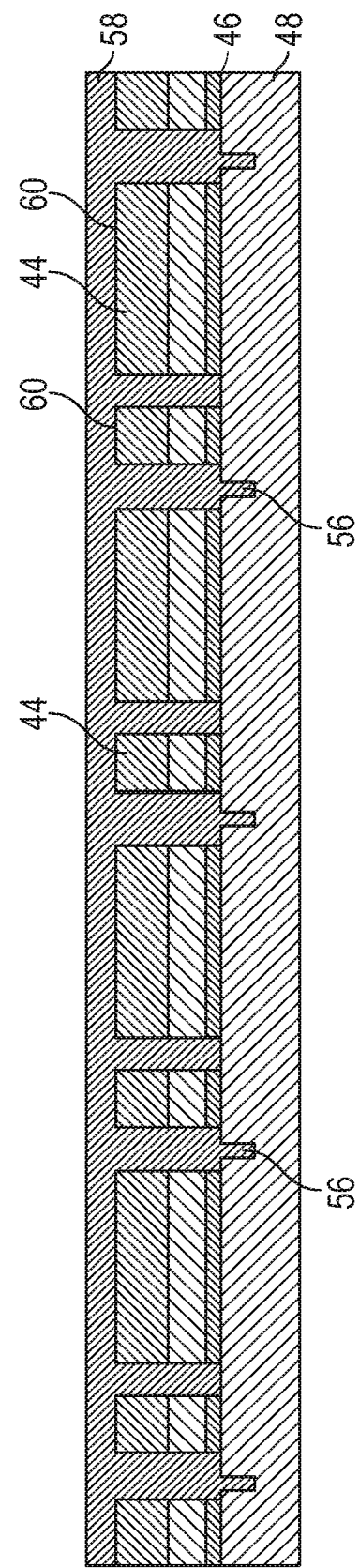

Referring to FIG. 3C, the method for forming the semiconductor package of FIG. 1 includes applying a mold compound 58 to the first side 46 of the wafer 48. The mold compound may include any type of mold compound disclosed herein and may be applied using, by non-limiting example, a liquid dispensing technique, a transfer molding technique, a vacuum molding technique, a glob top molding technique, or a compression molding technique. In various implementations, and as illustrated by FIG. 3C, the mold compound 58 may encapsulate the plurality of bumps 44 and fill the plurality of recesses 56. In other implementations, the mold compound 58 may only be applied within the plurality of recesses 56 and between the plurality of bumps 44 without flowing over the outer surfaces 60 of the plurality of bumps 44.

Figure 3D:
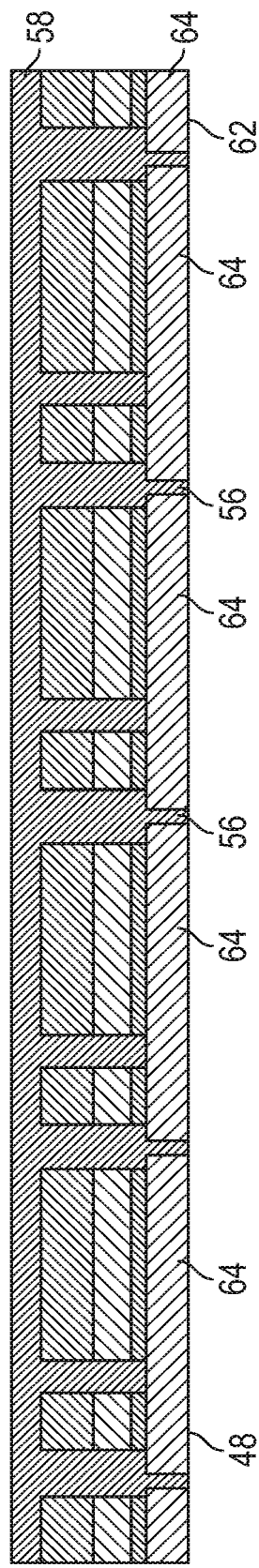

Referring to FIG. 3D, the method for forming the semiconductor package of FIG. 1 may include thinning a second side 62 of the wafer 48 to the desired depth of the plurality of recesses 56. In particular implementations, the method may include backgrinding a second side 62 of the wafer 48 to reach the plurality of recesses 56 and singulate a plurality of die 64 from the wafer. In implementations where the second side 62 of the wafer 48 is background, the backgrinding may use a process marketed under the trade name TAIKO by DISCO of Tokyo, Japan. The backgrinding leaves a ring of non-removed material (TAIKO ring) along the perimeter of the wafer which helps to prevent the wafer from curling, warping or otherwise bending during processing while at the same time removing most of the thickness and material of the second side 62, or backside of the wafer 48. The ring is then subsequently removed in a separate cutting step prior to singulation of the die. In other implementations of methods of forming semiconductor devices the TAIKO process may not be used, but some other backgrinding or other material-removal technique may be used, such as removing the material through a wet etch. In various implementations, the thinned wafer 48, or plurality of die 64, may be less than 50 um thick, while in other implementations the thinned wafer, or plurality of die, may be 50 or more um thick. The mold compound 58 coupled to the first side 46 of the wafer 48 and within the plurality of recesses 56 may facilitate thinning the wafer 48 by providing structural support to the wafer. In other implementations, the second side 62 of the wafer may not be thinned to the depth of the desired recesses 56. In this manner, the die of each semiconductor package may be stepped upon singulating the wafer 48.

Figure 3E:
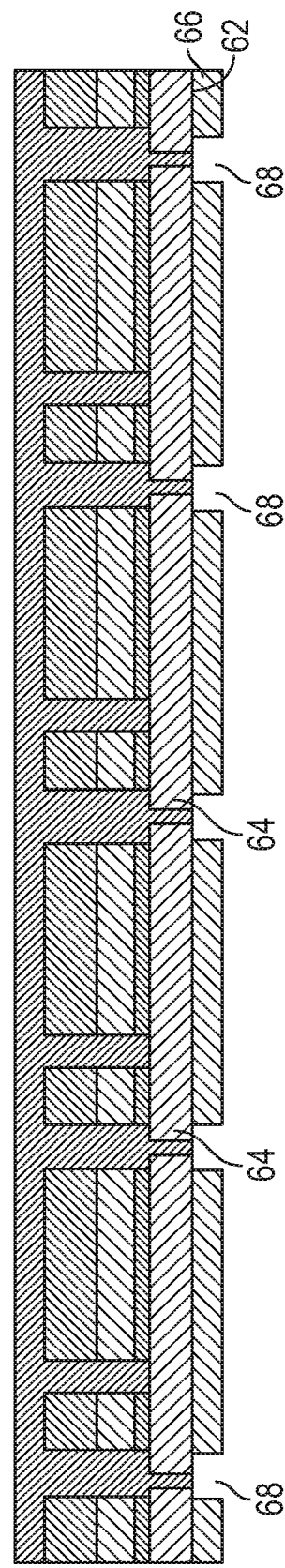

Referring to FIG. 3E, the method for forming the semiconductor package of FIG. 1 may include coupling a backside metal layer 66 to the second side 62 of the wafer 48 or to the second side of the plurality of die 64. The backside metal layer 66 may be any type of metal disclosed herein, and in particular implementations, may include copper. In various implementations, the backside metal layer may be coupled to the second side of the wafer through an electroplating process. In other implementations, the backside metal layer may be coupled to the second side of the wafer through a sputtering process or an electroplating process. In still other implementations, the backside metal layer may be a metal frame/film coupled to the wafer through, by non-limiting example, sintering, soldering, or fusion bonding. In various implementations, the backside metal layer 66 may be a thick backside metal layer and in particular implementations, may be as thick as or thicker than the thinned wafer 48. In various implementations, the method for forming the semiconductor package of FIG. 1 may include forming a plurality of openings 68 in the backside metal layer 66. In other implementations, the backside metal layer 66 may not include any openings therein. In implementations where a plurality of openings 68 are formed in the backside metal layer 66, the method may include, though not illustrated, applying a second mold compound to the second side 62 of the wafer 48 that fills the plurality of openings 68. The second mold compound may be the same as or different from the first mold compound 58. In various implementations, the second mold compound may also encapsulate the backside metal layer 66. In such implementations, the method may include backgrinding the second mold compound to expose the backside metal layer. In implementations with the second mold compound applied to the second side 62 of the wafer 48, the entirety of the die of the singulated semiconductor may be at least partially covered by a mold compound on all six sides of the die. In implementations where the second side 62 of the wafer 48 is background using the Taiko process, the Taiko ring may be removed after the backside metal is coupled to/formed on the second side of the wafer using a separate singulation process.

Figure 3F:
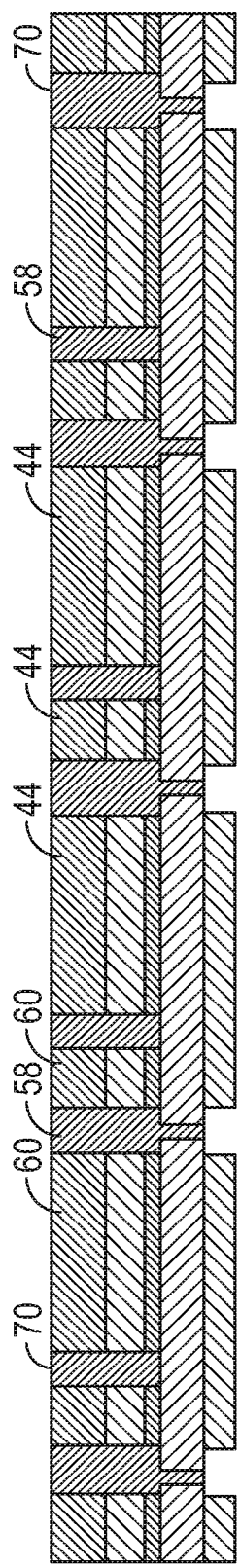

Referring to FIG. 3F, the method for forming the semiconductor package of FIG. 1 may include exposing the outer surface 60 of the plurality of bumps 44 through the mold compound 58 by grinding the mold compound 58. In various implementations, only the mold compound may be ground until it is coextensive with the surface 60, however, in other implementations the mold compound and a portion of the plurality of bumps 44 may be ground together. In this manner, the method may include planarizing the outer surface 60 of the plurality of bumps 44 with the outer surface 70 of the mold compound 58. The backmetal layer 66 may facilitate the thinning of the mold compound 58 by adding structural support to the wafer 48 and the plurality of die 64. In various implementations, and as illustrated by the order of FIGS. 3C-3F, the second side 62 of the wafer 48 may be thinned before the mold compound 58 is ground to expose the plurality of bumps 44, however, in other implementations the method may include grinding the mold compound 58 to expose the plurality of bumps before the second side 62 of the wafer 48 is thinned.

Figure 3G:
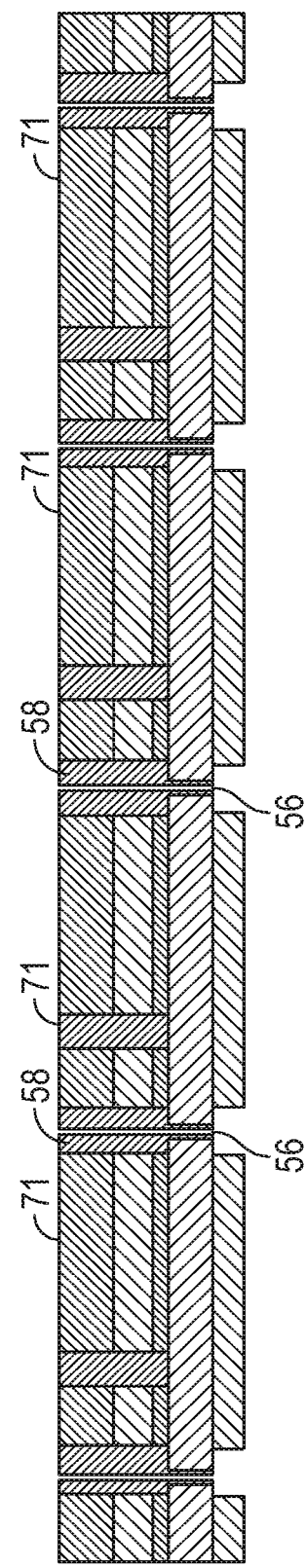

Referring to FIG. 3G, the method for forming the semiconductor package of FIG. 1 includes singulating the mold compound 58 through the plurality of recesses 56 into a plurality of semiconductor packages 71. The mold compound may be singulated using a saw, a laser, a plasma etch, water jet cutting, a chemical etch, or any other method for cutting or removing mold compound. In various implementations, the singulation line (or the width of the cut/etch made to singulate the mold compound) may be less wide as compared to the width of each recess of the plurality of recesses 56. In such implementations, the sidewalls of each die of the plurality of semiconductor packages may be covered by the mold compound 58. In implementations where the backside metal is not patterned, the backside metal may be singulated along with the mold compound to form the plurality of semiconductor packages.

Figure 4A:
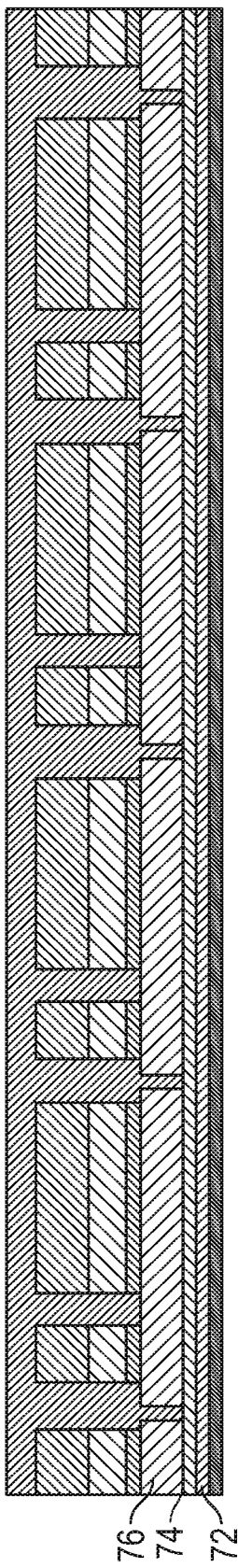
FIGS. 4A-4C are cross-section side views of a semiconductor device following various steps of a method for forming the semiconductor package of FIG. 2.
Figure 4B:
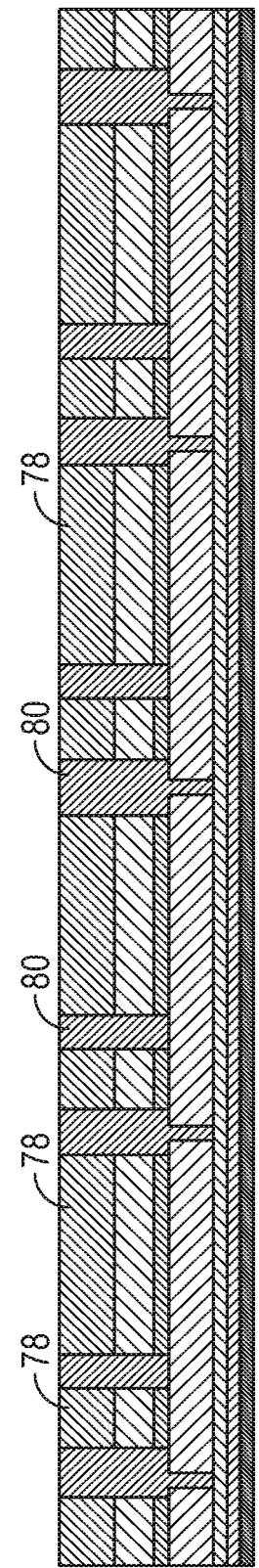
Figure 4C:
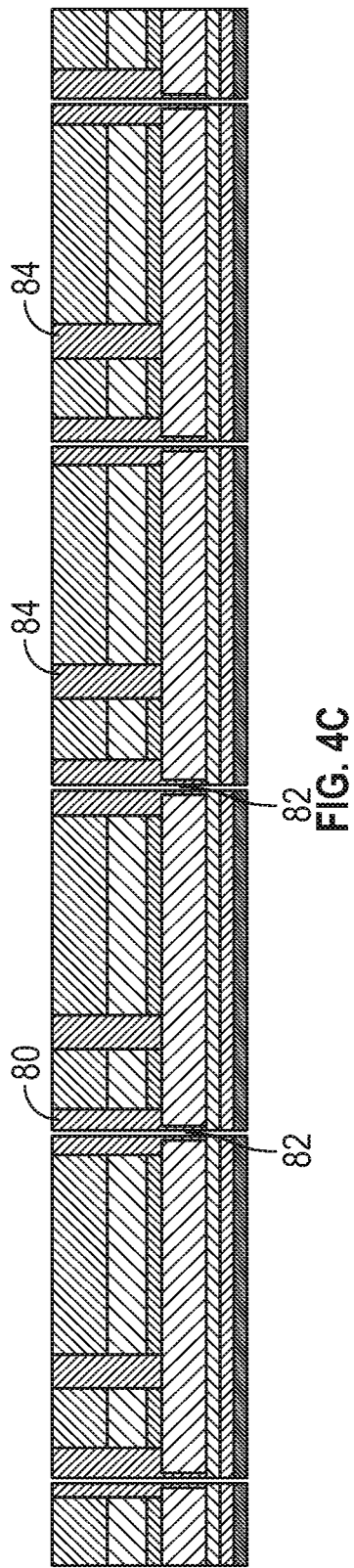

Referring to FIGS. 4A-4C, cross-section side views of a semiconductor device after steps of an implementation of a method for forming the semiconductor package of FIG. 2 are illustrated. Referring specifically to FIG. 4A, the method for forming the semiconductor package of FIG. 2 may be similar to the method illustrated in FIGS. 3A-3G, with the difference being that the method may include coupling a backside metal layer 72 to the second side 74 of the wafer 76 (or coupling a backside metal layer to a second side of the plurality of die), with the backside metal layer including multiple backside metal layers. In the implementation illustrated by FIG. 4A the method includes coupling a backside metal layer 72 which includes three different backside metal layers. In various implementations, the backside metal layer 72 may include more than or less than three backside metal layers. Each layer of the backside metal layer may be deposited to the wafer through, by non-limiting example, a sputtering or evaporation technique. In various implementations, the backside metal layer may include, by non-limiting example, titanium, nickel, silver, copper, vanadium, or any other metal. In particular implementations, the backside metal layer may include a titanium layer, a nickel layer, and a silver-copper layer. In other particular implementations, the backside metal layer may include a titanium layer, a nickel-vanadium layer, and a silver-copper layer. In various implementations, and as illustrated by FIG. 4A, the backside metal layer 72 may be patterned or may not be patterned.

Referring to FIG. 4B, the method for forming the semiconductor package of FIG. 2 may include exposing the plurality of bumps 78 through the mold compound 80 by grinding the mold compound. The plurality of bumps may be exposed using the same method or a similar method as described above in relation to FIG. 3F.

Referring to FIGS. 4A and 4C, the method for forming the semiconductor package of FIG. 2 includes singulating the mold compound 80 through the plurality of recesses 82 and the backside metal layer 72 into a plurality of semiconductor packages 84. The mold compound 80 and the backside metal layer 72 may be singulated using any method disclosed herein. As the backside metal layer is not patterned, the sidewalls of the backside metal layer may be coextensive with the sides of the respective semiconductor packages 84.

The methods for forming semiconductor packages disclosed herein may allow for the formation of thin die without needing a dual metallization process for the purpose of stress balance. The mold compound and the backside metal layer may offer the necessary support needed to handle the thinned die and wafer during formation of the semiconductor packages.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method for forming a semiconductor package comprising:
    forming a plurality of bumps on a first side of a wafer;
    forming a plurality of recesses into the first side of the wafer to a desired depth into the wafer;
    applying a mold compound to the first side of the wafer, wherein the mold compound encapsulates the plurality of bumps and fills the plurality of recesses;
    thinning a second side of the wafer to the desired depth of the plurality of recesses;
    coupling a backside metal layer to the second side of the wafer;
    exposing the plurality of bumps through the mold compound by grinding the mold compound;
    forming a plurality of openings through the backside metal layer; and
    singulating the mold compound through the plurality of recesses into a plurality of semiconductor packages.

2. The method of claim 1, wherein each bump of the plurality of bumps comprises a first metal layer and a second metal layer, wherein the first metal layer is between the second metal layer and the wafer.

3. The method of claim 2, wherein the second metal layer comprises tin.

4. The method of claim 2, wherein each bump of the plurality of bumps further comprises a third metal layer, wherein the first metal layer comprises copper, the second metal layer comprises tin, and the third metal layer comprises aluminum.

5. The method of claim 1, wherein the backside metal layer comprises copper.

6. The method of claim 1, further comprising planarizing the outer surface of the plurality of bumps with the outer surface of the mold compound.

7. The method of claim 1, wherein the second side of the wafer is thinned before the plurality of bumps are exposed.

8. A method for forming a semiconductor package comprising:
    forming a plurality of bumps on a first side of a wafer;
    forming a plurality of recesses into the first side of the wafer;
    applying a mold compound to the first side of the wafer, wherein the mold compound encapsulates the plurality of bumps and fills the plurality of recesses;
    backgrinding a second side of the wafer to reach the plurality of recesses and singulate a plurality of die from the wafer;
    coupling a backside metal layer to a second side of the plurality of die;
    exposing the plurality of bumps through the mold compound by grinding the mold compound; and
    singulating the mold compound at the plurality of recesses to form a plurality of semiconductor packages.

9. The method of claim 8, wherein each bump of the plurality of bumps comprises a first metal layer and a second metal layer, wherein the first metal layer is between the second metal layer and the wafer.

10. The method of claim 9, wherein each bump of the plurality of bumps comprises a third metal layer.

11. The method of claim 9, wherein the second metal layer comprises tin.

12. The method of claim 8, wherein the backside metal layer comprises a metal including one of titanium, nickel, silver, vanadium, copper, and any combination thereof.

13. The method of claim 8, further comprising planarizing the outer surface of the plurality of bumps with the outer surface of the mold compound.

14. The method of claim 8, wherein the second side of the wafer is background before the plurality of bumps are exposed.

* * * * *